(12) United States Patent
Love et al.

(10) Patent No.: US 9,465,077 B2
(45) Date of Patent: Oct. 11, 2016

(54) BATTERY HEALTH MONITORING SYSTEM AND METHOD

(71) Applicants: Corey T Love, Arlington, VA (US); Karen Swider-Lyons, Alexandria, VA (US)

(72) Inventors: Corey T Love, Arlington, VA (US); Karen Swider-Lyons, Alexandria, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 564 days.

(21) Appl. No.: 13/705,891

(22) Filed: Dec. 5, 2012

(65) Prior Publication Data

US 2013/0141109 A1   Jun. 6, 2013

Related U.S. Application Data

(60) Provisional application No. 61/566,787, filed on Dec. 5, 2011.

(51) Int. Cl.
*G01N 27/416* (2006.01)
*G01R 31/36* (2006.01)

(52) U.S. Cl.
CPC ....... *G01R 31/3606* (2013.01); *G01R 31/3662* (2013.01); *G01R 31/3679* (2013.01)

(58) Field of Classification Search
USPC ....................................................... 324/430
See application file for complete search history.

(56) References Cited

U.S. PATENT DOCUMENTS

| | | | |
|---|---|---|---|
| 6,924,652 B2* | 8/2005 | Jang ...................... | C08J 3/248 |
| | | | 324/607 |
| 2003/0224544 A1* | 12/2003 | Prisco et al. .................... | 438/16 |
| 2006/0170397 A1* | 8/2006 | Srinivasan et al. ........... | 320/132 |
| 2007/0090843 A1* | 4/2007 | De Doncker ...... | G01R 31/3662 |
| | | | 324/426 |
| 2008/0120050 A1 | 5/2008 | Iwane et al. | |
| 2011/0089907 A1* | 4/2011 | Bhardwaj et al. ............ | 320/136 |
| 2011/0295533 A1 | 12/2011 | Porcellato | |
| 2011/0301931 A1* | 12/2011 | Gering ............................ | 703/13 |

OTHER PUBLICATIONS

Huet, F.; "A review of impedance measurements for determination of the state-of-charge or state-of-health of secondary batteries," Journal of Power Sources, 70(1), p. 59-69, 1998.

(Continued)

*Primary Examiner* — Robert Grant
(74) *Attorney, Agent, or Firm* — US Naval Research Laboratory; Richard F. Bis

(57) ABSTRACT

A method and system for monitoring the health of a battery is provided. A precision frequency can be determined for the battery by applying one of an AC current or voltage perturbation across a frequency sweep with impedance spectroscopy equipment to obtain an impedance response; collecting data related to the impedance response at a plurality of various states of charge within a recommended voltage window of the battery; plotting the collected data on one or more impedance curves; and analyzing the one or more impedance curves at the various states of charge to determine the precision frequency. Next, one of an AC current or voltage perturbation can be applied at the precision frequency resulting in an impedance response. The value of the impedance response can be recorded, and a determination can be made of a battery classification zone that the impedance value falls within.

17 Claims, 5 Drawing Sheets

(56) References Cited

OTHER PUBLICATIONS

GirishKumar, G., et al.; "Electrochemical and Spectroscopic Investigations of the Overcharge Behavior of StabiLife Electrolyte Salts in Lithium-Ion Batteries," Journal of the Electrochemical Society, vol. 158(2), p. A146-A153, 2011.

Xing, Weibing, "Unusual overcharge tolerance behavior in gelled polymer lithium ion cells," Journal of Power Sources, vol. 109(1), p. 167-171, 2002.

Kong, Weihe, et al.; "Gas evolution behaviors for several cathode materials in lithium-ion batteries," Journal of Power Sources, vol. 142(1-2), p. 285-291, 2005.

Ohsaki, T., et al.; "Overcharge reaction of lithium-ion batteries;" Journal of Power Sources, vol. 146(1-2), p. 97-100, 2005.

Leising, R.A., et al.; "Abuse testing of lithium-ion batteries—Characterization of the overcharge reaction of LiCoO2/graphite cells;" Journal of the Electrochemical Society, vol. 148(8), p. A838-A844, 2001.

Kise, M., et al.; "Alternating current impedance behavior and overcharge tolerance of lithium-ion batteries using positive temperature coefficient cathodes;" Journal of the Electrochemical Society, vol. 153(6), p. A1004-A1011, 2006.

Arora, P., White, R.E., and Doyle, M.; "Capacity fade mechanisms and side reactions in lithium-ion batteries;" Journal of the Electrochemical Society, vol. 145(10), p. 3647-3667, 1998.

Belov, D. and M.H. Yang; "Investigation of the kinetic mechanism in overcharge process for Li-ion battery;" Solid State Ionics, vol. 179(27-32), p. 1816-1821, 2008.

Zhang, J. and Lee, J.; "A review on prognostics and health monitoring of Li-ion battery;" Journal of Power Sources, vol. 196(15), p. 6007-6014, 2011.

International Prelimiinary Report on Patentability for PCT/US12/067949 issued on Jun. 10, 2014.

* cited by examiner

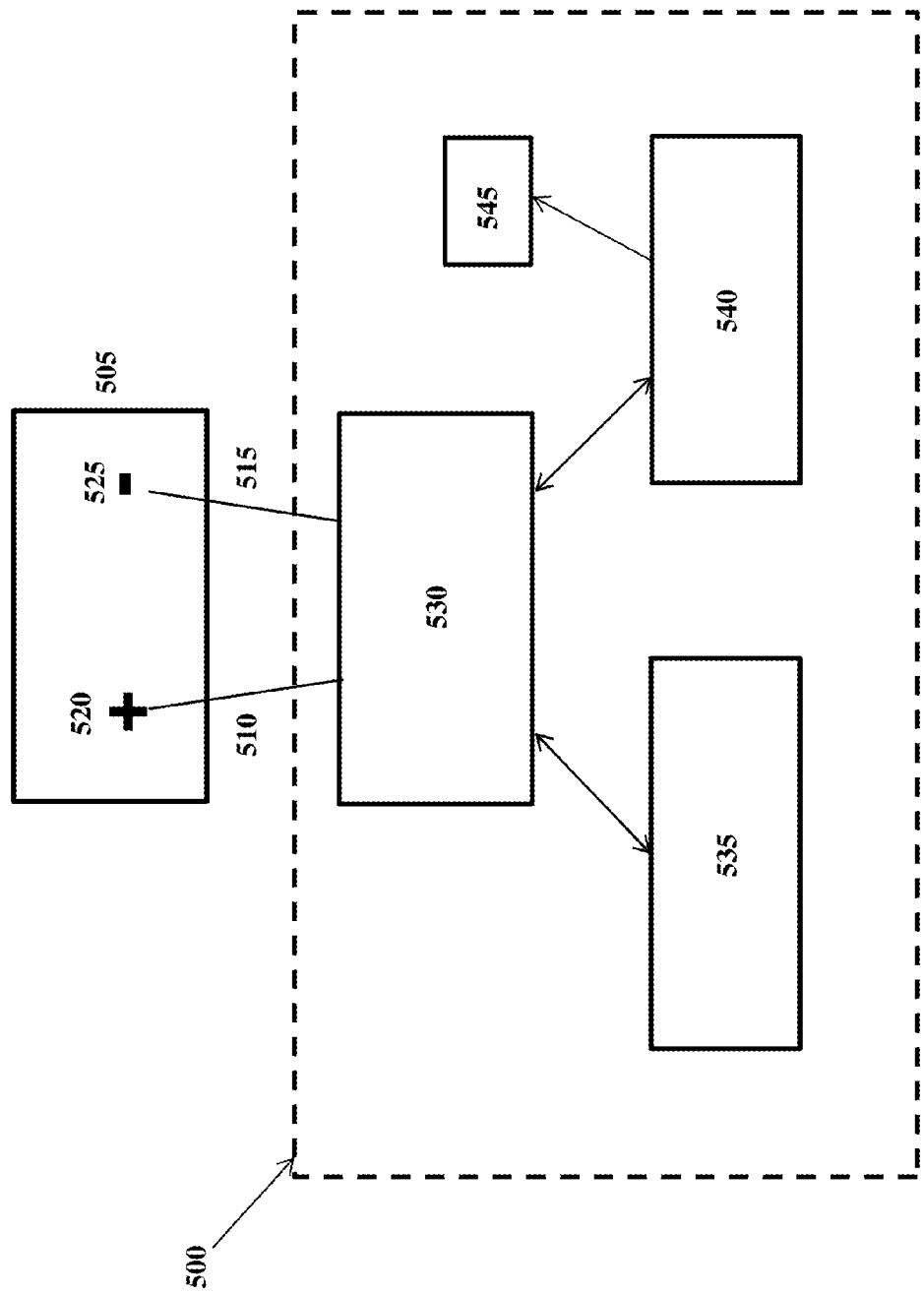

BATTERY HEALTH MONITORING SYSTEM AND METHOD

CROSS-REFERENCE TO RELATED APPLICATIONS

This application claims priority to provisional patent application entitled, "Battery Health Monitoring Method," filed on Dec. 5, 2011, and assigned U.S. Application No. 61/566,787; the entire contents of which are hereby incorporated by reference.

FIELD OF THE INVENTION

The invention relates generally to battery health monitoring. More particularly, the invention relates to a diagnostic method for monitoring the state-of-health of rechargeable batteries and identifying defective batteries to be taken out of service before causing a serious safety hazard.

BACKGROUND

In general, battery state of health defines the performance of a battery relative to its original condition. Changes in the state of health from the original condition typically signals performance loss due to aging processes or a battery's end-of-life. Historically, state-of-health methods have been developed to predict the remaining life of valve-regulated lead-acid rechargeable batteries in combustion engine vehicles. Recently, the focus has shifted towards state of health methods for rechargeable batteries used in hybrid electric vehicle and electric vehicle applications. In the emerging markets, battery usage history is coupled with physical metrics of electrical current and operating temperature to estimate the remaining usage life of the battery.

Traditional methods for battery state of health typically related to capacity evaluation and the state of the batteries' remaining performance life. These methods involved discharging batteries at constant current to predefined voltages, which is expensive, time consuming, and requires the batteries under test to be out of service for extended periods of time. Traditional commercial state of health testers measure impedance by applying an AC current at a single-frequency or as a square-wave pulse. The frequency at which each tester operates varies depending upon the manufacturer. See, e.g., Hewlett-Packard, 1000 Hz; Biddle Instruments, 60 Hz; Celltron, ~10 Hz; and Midtronics, 25 Hz. The output values are also specific to the manufacturer. Each of these testers operates at high frequency where the battery impedance is nearly the internal resistance value. The internal resistance value was found to have strong relationship with the remaining capacity of the battery. In short, the earliest uses of state of health monitor were to relate impedance and remaining useful life.

Lithium-ion batteries are state-of-the-art rechargeable power sources for high energy electronic devices such as missile systems, torpedoes, communication equipment, and night vision goggles. Recent safety incidents involving thermal runaway reactions in lithium-ion batteries have arisen resulting in fire and the subsequent loss of equipment and resources. Safety of lithium-ion batteries is critical to fulfill many types of activities, including military operations. Overcharging lithium-ion batteries decreases their capacity and cycling performance and increases the risk for venting toxic materials, fire and explosion.

To avoid overcharging lithium-ion batteries, information must be known about the type of lithium-ion batteries being utilized. Specifically, the upper and lower voltage limits for charging are specific to the chemistry of the positive/negative electrode couple and electrolyte materials. The most common Li-ion battery cathode material is $LiCoO_2$ which has an upper voltage limit of 4.2 V and a lower limit of 2.8 V vs. $Li^+/Li^0$. Charging above the 4.2 V cutoff voltage, or overcharging, is often the result of improper charging practices, faulty cell balancing electronics in multi-cell batteries, thermal imbalances in battery packs, and/or cell manufacturing defects. The direct path from overcharge abuse to thermal runaway is not entirely understood, but is believed to comprise the following steps: positive electrode materials undergo structural transformations and release oxygen during overcharge, where the greatest quantities are evolved with voltage, temperature; and the oxidation ability of the active material resulting in rapid exothermic reactions with the electrolyte solvent. The release of gaseous species causes pouch swelling, venting or even rupture of the cell packaging which is dictated by the severity of the overcharge current and voltage. At potentials >4.5 V organic electrolytes decompose forming insoluble products which block the pores of the electrode and cause gas generation in the cell. Abusive charge practices (overcharge and high rate charging) result in plating lithium metal on the anode surface. These lithium defects may grow with abusive charge cycling resulting in either an internal short circuit or a violent reaction between the overcharged anode and electrolyte. Overcharge of just one cell is significant since a failure resulting in explosion or fire can easily cascade to other cells in a battery pack.

There are no prognostic methods for lithium-ion batteries to detect degradation or predict an imminent failure. Health monitoring and prognostics for Li-ion are limited to state-of-charge determination, voltage estimation, capacity estimation, and RUL prediction. One proposed health monitoring method calls for periodic voltage and temperature readings transmitted through the use of an RFID (radio frequency identification) tag. These traditional methods lack the specific ability to diagnose the degradation processes that occur due to abuse (either internal or external) and that seriously affects the ability of the battery to perform in a safe manner.

Accordingly, there remains a need in the art for an impedance diagnostic method for monitoring the state-of-health of rechargeable lithium ion batteries and diagnosing battery defects. The diagnostic method should be able to act as a diagnostic to determine the health of lithium-ion batteries and a prognostic for battery failure. The ultimate purpose of the method is to identify defective batteries to be taken out of service before causing a serious safety hazard.

SUMMARY OF THE INVENTION

According to one aspect of the invention, a method for monitoring the health of a battery is provided. A precision frequency can be determined for the battery by applying one of an AC current or voltage perturbation across a frequency sweep with impedance spectroscopy equipment to obtain an impedance response; collecting data related to the impedance response at a plurality of various states of charge within a recommended voltage window of the battery; plotting the collected data on one or more impedance curves; and analyzing the one or more impedance curves at the various states of charge to determine the precision frequency. Next, one of an AC current or voltage perturbation can be applied at the precision frequency resulting in an impedance response. The value of the impedance response can be recorded, and a determination can be made of a battery classification zone that the impedance value falls within.

According to another aspect of the invention, a system for monitoring the health of a battery is provided that comprises impedance spectroscopy equipment configured to determine a precision frequency for a battery, apply one of an AC current or voltage perturbation at the precision frequency resulting in an impedance response, and record a value of the impedance response. The impedance spectroscopy equipment can be configured to determine the precision frequency by applying one of an AC current or voltage perturbation across a frequency sweep to obtain an impedance response, and collect data related to the impedance response at a plurality of various states of charge within a recommended voltage window of the battery. Next, a precision frequency computer module can be configured to plot the collected data on one or more impedance curves, and analyze the one or more impedance curves at the various states of charge to determine the precision frequency. Finally, a battery classification zone module can be configured to determine a battery classification zone that the recorded impedance value falls within.

These and other aspects, objects, and features of the present invention will become apparent from the following detailed description of the exemplary embodiments, read in conjunction with, and reference to, the accompanying drawings.

BRIEF DESCRIPTION OF THE DRAWINGS

FIG. 5 is a battery health monitoring system in accordance with an exemplary embodiment of the invention.

DETAILED DESCRIPTION OF EXEMPLARY EMBODIMENTS

Figure 1:
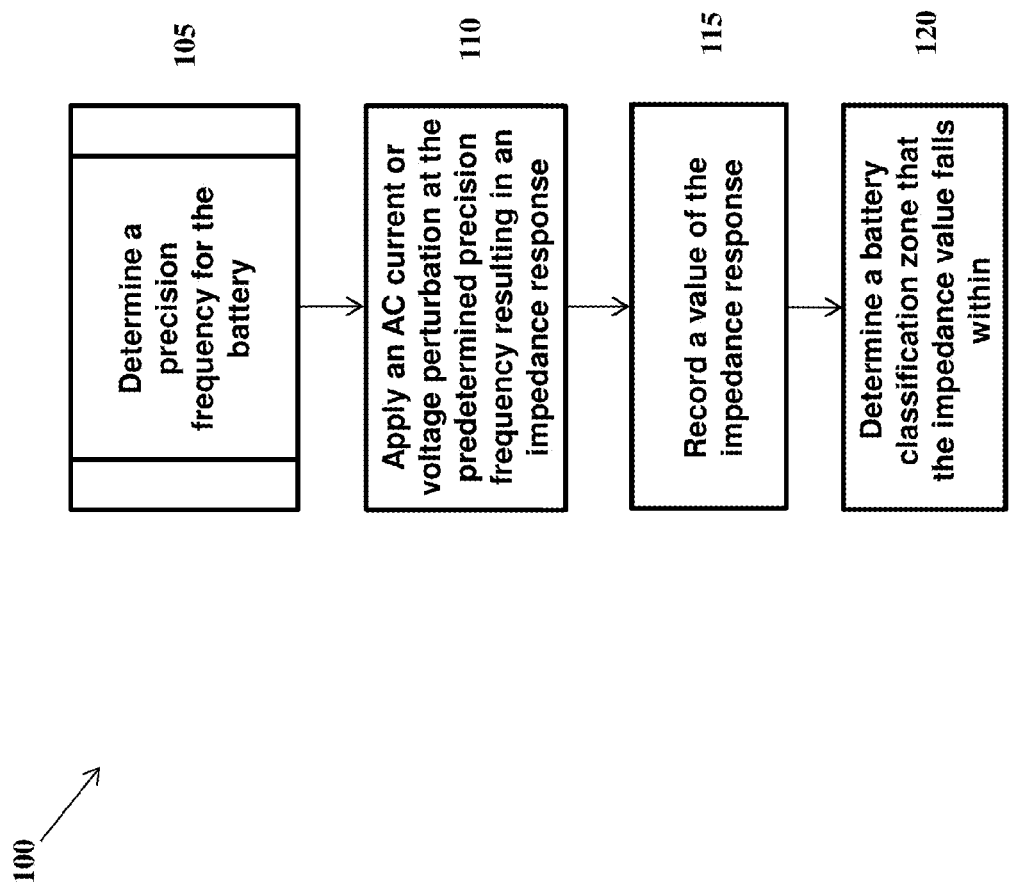
FIG. 1 is flow chart illustrating a battery health diagnostic method in accordance with an exemplary embodiment of the invention.

Referring now to the drawings, in which like numerals represent like elements, aspects of the exemplary embodiments will be described in connection with the drawing set.

Figure 2:
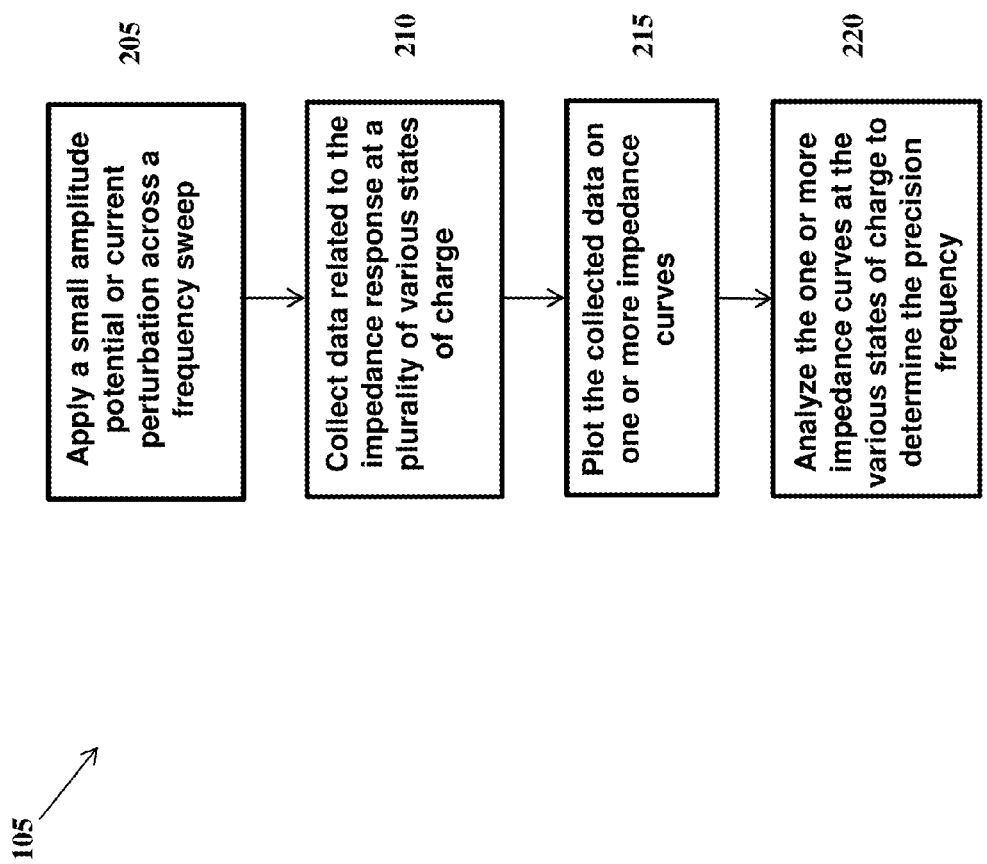
FIG. 2 is flow chart illustrating a method for determining a precision frequency for a battery in accordance with an exemplary embodiment of the invention.

In general, in an exemplary embodiment of the invention an impedance diagnostic and prognostic technique and system that can be utilized that monitors the health of batteries, such as rechargeable lithium-ion batteries. The method can measure and monitor the state of health of batteries regardless of the state of charge; and therefore, can be useful during charging, discharging or during periods of rest (e.g., no current flow). FIG. 1 is flow chart 100 illustrating a battery health diagnostic method in accordance with an exemplary embodiment of the invention. In Step 105, a precision frequency can be determined for the battery. FIG. 2 is flow chart 105 illustrating a method for determining a precision frequency for a battery in accordance with an exemplary embodiment of the invention. In Step 205, a small amplitude potential or current perturbation can be applied across a frequency sweep using standard impedance spectroscopy equipment to get an impedance response. For example, the frequency sweep can be from 100 kHz to 0.10 mHz. One of ordinary skill in the art will understand that standard impedance spectroscopy equipment can include electrical hardware capable of generating a current or potential perturbation at various amplitudes and/or frequencies, such as a potentiostat (perturbation generator), coupled with electrical hardware for measuring the resulting electrical impedance response to the applied potential or current, such as an impedance gain-phase analyzer. The hardware should have at least two leads to connect to the positive and negative terminals of the battery. One of ordinary skill in the art will understand that other electrical hardware configurations, not described herein, can also be used.

In Step 210, the impedance response data can be collected at various states of charge within the recommended voltage window of the battery. For example, data can be collected when the battery is 0% charged, 10% charged, 20% charged, 30% charged . . . 100% charged. In Step 215, the impedance response data can be plotted into multiple impedance curves for the various states of charge. In step 220, the one or more impedance curves can be analyzed at the various states of charge to determine the precision frequency. The precision frequency can be determined by noting where the impedance values are nearly the same among the various states of charge. That is because the impedance at the precision frequency is nearly independent of state of charge within the battery manufacturer's recommended voltage window. One of ordinary skill in the art will understand that a precision frequency computer module can be utilized to collect the impedance response data and determine the precision frequency. For example, the precision frequency computer module can include standard spreadsheet and plotting software that can be used for analysis of the data to identify the precision frequency. In an exemplary embodiment of the invention, the frequency at which the standard deviation is the smallest between the various states of charge can be the precision frequency.

After determining the precision frequency in Step 105, in Step 110, an AC current or voltage perturbation can be applied at the predetermined precision frequency (i.e., a single impedance data point). As noted, the impedance can be measured in two different ways: application of small potential (e.g., approximately 10 mV), or application of small current (e.g., approximately 10 mA). One of ordinary skill in the art will understand that several hardware schemes can be utilized to carry out the proposed single-point impedance health monitoring method.

In Step 115, the impedance value can be recorded, and then, in Step 120, a determination can be made whether the impedance value is in a healthy battery zone. The healthy battery zone can be established as a range of impedance values the represent a normal and safe operation of the battery, and where normal battery operation can continue. The data collected in Step 105 can be utilized to establish the healthy zone for the particular battery type being monitored. However, the healthy zone must be established for each battery type and depends upon other factors, such as battery chemistry, size, and geometry.

Other battery classification zones can also be established in addition to the healthy battery zone. Each of these zones can define a battery health status zone. For example a damaged battery zone can represent a battery that has a single overcharge or over-discharge abuse, and it may be recommended that the battery is removed from operation. Another zone, an unsafe battery zone, can represent excessive overcharge or over-discharge damage, and that the battery should be remove from service immediately.

One of ordinary skill in the art will understand that a battery classification zone module can be utilized to make the determination in Step 120 whether the impedance value recorded in Step 115 falls in a particular battery classification zone. For example, the battery classification zone module can utilize the data collected in Step 105 to define the different zones, such as healthy, damaged, and unsafe, for the battery type that is being analyzed. Then, in Step 120, the battery classification zone module can compare the recorded impedance value to the different zones, and determine which zone properly describes the health of the battery. Furthermore, the battery classification zone module can provide an indicator that displays the determined battery classification zone.

In addition, one of ordinary skill in the art will understand that the battery classification zone module can maintain a database of zones for other battery types. Furthermore, one of ordinary skill in the art will understand that several hardware schemes can be utilized to indicate the determined battery classification zone.

Figure 3:
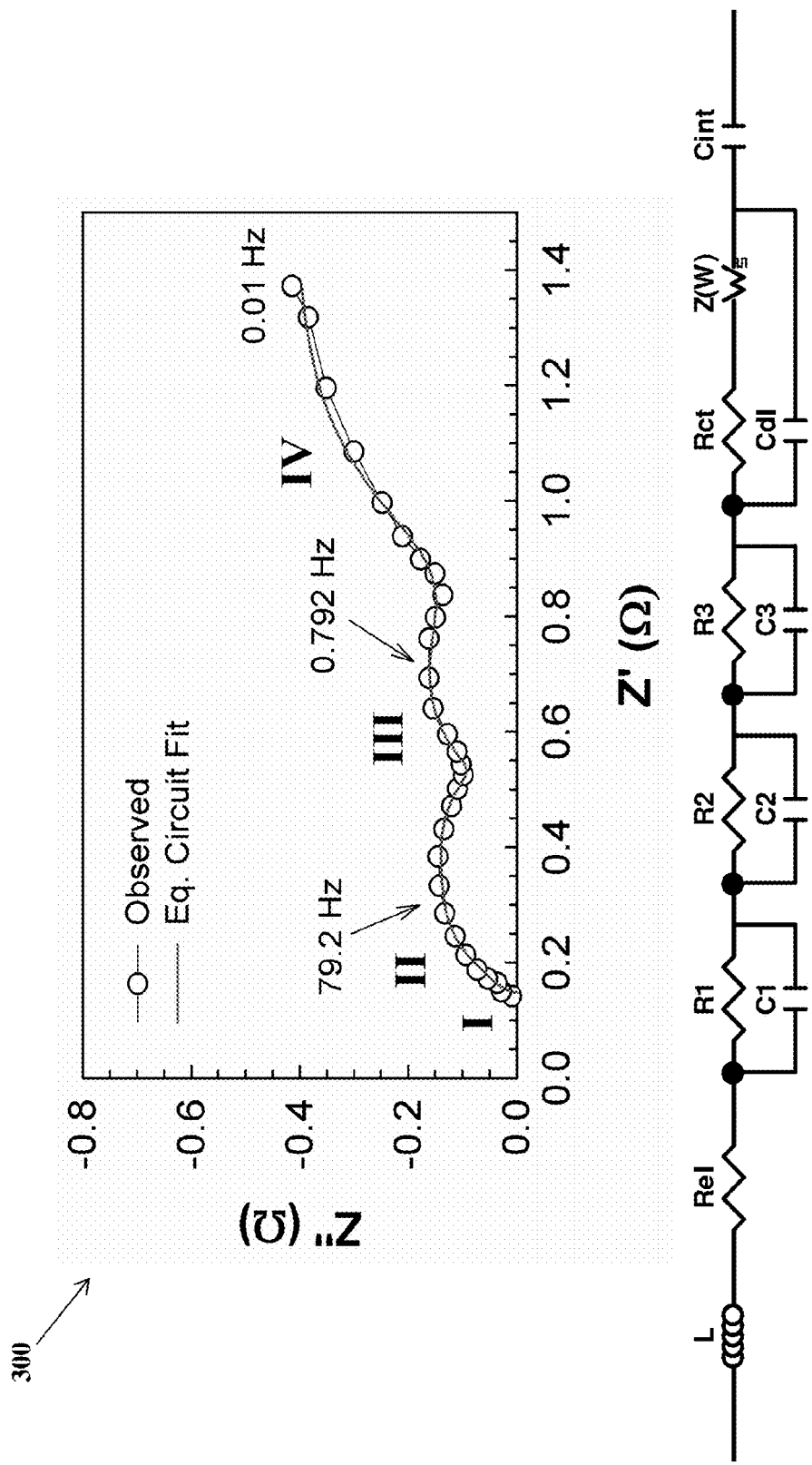
FIG. 3 is a Nyquist plot of the impedance diagram where Z' is the real impedance and Z" is the imaginary impedance in accordance with an exemplary embodiment of the invention.

In an application of the exemplary method of the invention, data collected from the battery health monitoring method will be presented. As noted, in Step 205, a small amplitude potential or current perturbation can be applied across a frequency sweep (e.g., 100 kHz to 0.10 mHz) to get an impedance response using standard impedance spectroscopy equipment. In Step 210, the impedance data can then be collected at various states of charge within the recommended voltage window of the battery (e.g. 0, 10, 20, 30 . . . 100%). FIG. 3 is a Nyquist plot 300 of the impedance diagram where $Z'$ is the real impedance and $Z''$ is the imaginary impedance, in accordance with an exemplary embodiment of the invention. The plot, as noted in Step 215, is segmented into 4 regions. Region I represents the high frequency resistance due to electrolyte, separator and electronic contacts. Region II represents the impedance of Li-ion transport through the surface passivation layer. Region III represents the charge transfer at the surface film/electrolyte interface. Finally, Region IV represents the Warburg impedance associated with Li-ion diffusion into the bulk structure of the electrodes.

Valuable battery state of health information can be ascertained at two distinct locations along the Nyquist plot 300 curve. The first location, the $Z''=0$ intercept, denoted as Region I, can provide the internal resistance of the cell. This high frequency real impedance value can yield the resistance contribution of internal components, such as the electrolyte and separator, and external battery components, such as the terminal leads and connections. Degradation processes and defects in batteries originate from decomposition of electrolyte and interaction between electrolyte and the solid electrolyte interface. Structural degradation or weakening of the polymer separator due to dendrite formation on the negative electrode will increase the high frequency impedance. Detection of degradation processes can then be obtained through constant monitoring of the impedance response for a small voltage perturbation applied at the frequency where $Z''=0$. The high frequency intercept can vary across chemistries and pack levels, but has been proven reproducible for diagnosing physical abuse due to battery overcharge while being completely independent of battery state-of-charge.

The second location along the curve where valuable battery state of health information can be ascertained is known as the "precision frequency." The precision frequency can be ascertained through statistical analysis of baseline impedance measurements taken between the normal operating voltage ranges, as noted in Step 220. The idea is to identify the frequency where the cell experiences the smallest variation in impedance during charging and discharging. As noted, then in Step 110, an AC current can then applied at the precision frequency and the impedance can be recorded. A delta impedance value ($\pm Z'$, $\pm Z''$) can be selected from the precision data collected during normal charge and discharge as noted in Step 115. Impedance data outside of the precision range can be considered suspect prognosticating a potential safety hazard, as noted in Step 120.

Figure 4:
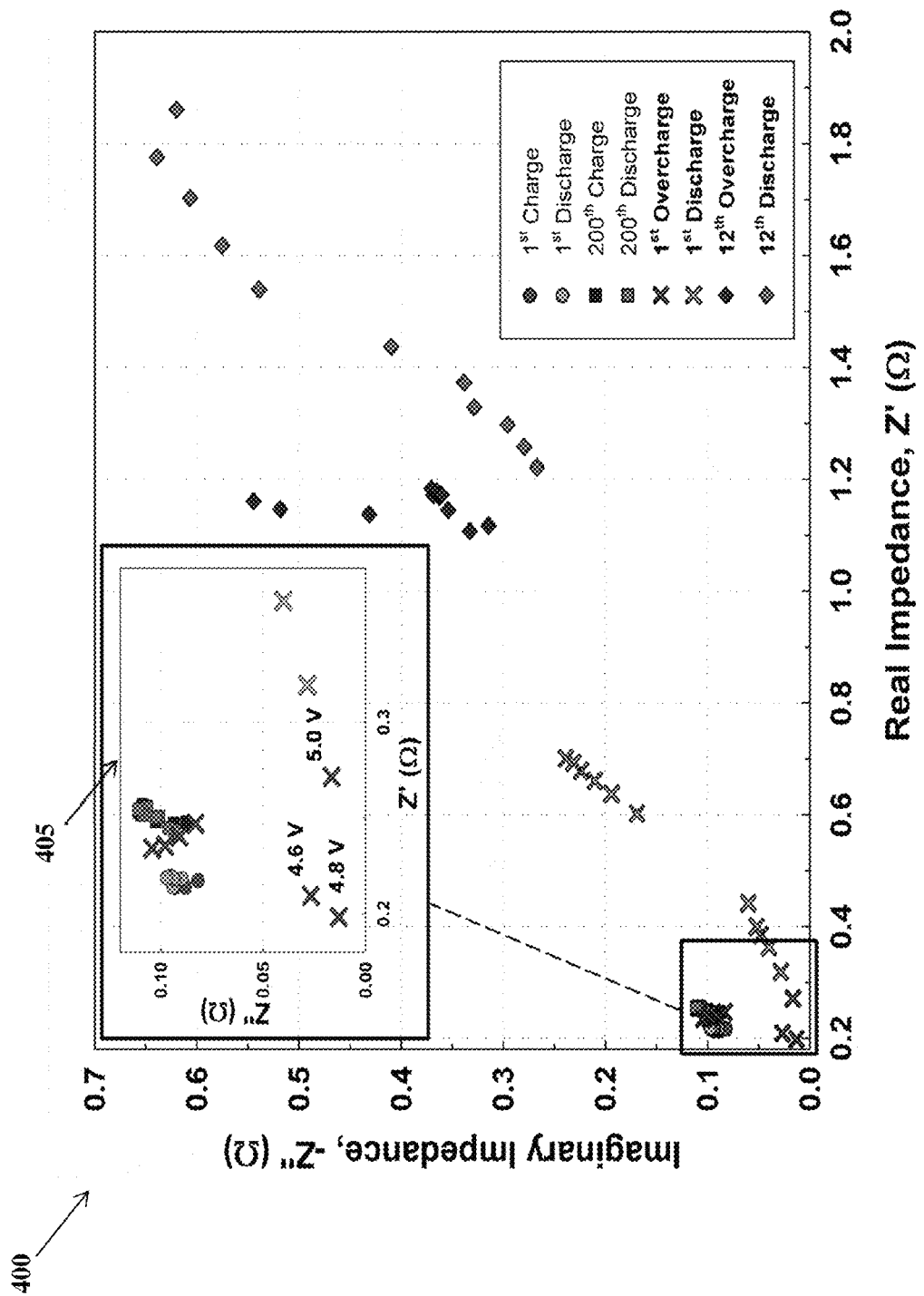
FIG. 4 is a chart of the impedance data collected at various states of charge using the precision frequency in accordance with an exemplary embodiment of the invention.

In a test utilizing an exemplary embodiment of the invention, a commercial 20 mAh $LiCoO_2$ lithium-ion battery cell was found to have a precision frequency of 500 Hz. FIG. 4 is a chart 400 of the impedance data collected at various states of charge using the precision frequency. The tight grouping of impedance values indicates a healthy lithium-ion battery functioning within a tailorable resistance region. This region can expand as safety requirements are relaxed or contract where ultimate safety precautions are needed. Damage to the lithium-ion battery resulting from an internal defect (e.g., manufacturing flaw, growth of resistive surface layers on the electrodes, and presence of an internal short) or external abuse (e.g., overcharge, over-discharge, high temperature, and high charge/discharge rates) can be detectable with single-point impedance. In an exemplary embodiment of the invention, this method can be sensitive enough to diagnose abuse caused by overcharge after a single charge cycle of +400 mV over the manufacturer's recommended cutoff voltage. Furthermore, the exemplary technique has been shown to be successful and repeatable across several size platforms of lithium-ion batteries.

In the test of the commercial 20 mAh $LiCoO_2$ lithium-ion battery cell, the $Z'$ and $Z''$ numbers at 500 Hz track well the changes observed during overcharge. For example, during a single overcharge above 4.4 V (see, FIG. 4 inset 405) through 5.0 V the imaginary impedance ($-Z''$) values decrease, and approach the zero axis. After the $1^{st}$ overcharge to 5.0 V, there is a 2-stage linear increase in impedance during discharge. Between 5.0-4.0 V the imaginary impedance changes slowly with respect to the real impedance ($dZ''/dZ' \approx -1.16$). This is most likely due to impedance associated with electrolyte breakdown, increasing $R_{el}$ (internal impedance). Between 4.0 V-2.8 V discharge, the imaginary impedance changes sharply with respect to real impedance ($dZ''/dZ' \approx -4.26$). The $12^{th}$ overcharge shows a large grouping of impedance data well above the values after the $1^{st}$ overcharge. The impedance values continue to increase and the grouping expands into the $12^{th}$ discharge.

FIG. 5 is a battery health monitoring system 500 in accordance with an exemplary embodiment of the invention. In general, the battery health monitoring system 500 can be utilized to monitor the health of batteries, such as rechargeable lithium-ion batteries. The battery health monitoring system 500 can be connected to a battery 505 by at least two leads 510 and 515 connected to the positive terminal 520 and negative terminal 525 of the battery 505. Impedance spectroscopy equipment 530 can be configured to determine a precision frequency for the battery 505 by applying one of an AC current or voltage perturbation across a frequency sweep to obtain an impedance response and collect data related to the impedance response at a plurality of various states of charge within a recommended voltage window of the battery 505. A precision frequency computer module 535 can then be configured to plot the collected data on one or more impedance curves, and can analyze the one or more impedance curves at the various states of charge to determine the precision frequency.

The impedance spectroscopy equipment 530 can then be configured to apply one of an AC current or voltage perturbation at the precision frequency which was determined by the precision frequency computer module 535. The application of one of an AC current or voltage perturbation at the precision frequency of the battery 505 can produce an impedance response, and a value of the impedance response can be recorded. Finally, a battery classification zone module 540 can be configured to determine a battery classification zone that the recorded impedance value falls within. The battery classification zone module 540 can then send a signal to a display 545 to indicate the determine battery classification zone.

In an example of an exemplary battery health monitoring system 500, the impedance spectroscopy equipment 530 can include a potentiostat configured to apply one of an AC current or voltage perturbation, and an impedance gain-phase analyzer configured to measure the impedance response. The precision frequency computer module 535 can incorporate a standard spreadsheet and plotting software to determine the precision frequency. In addition, the precision frequency computer module 535 and the battery classification zone module 540 can be implemented in a computer system together or separately. Finally, the display 545 can be configured to display text, colors, sounds, or other display mechanisms that indicate the determined battery health zone classification. In addition, one of ordinary skill in the art will understand that other electrical hardware, computer module configurations, and display mechanisms, not described herein, can also be used.

In summary, the exemplary method provides a means for monitoring the health of a battery in real-time (in situ). This method is able to diagnose internal battery degradation due to abuse such as an overcharge or over-discharge, and can be utilized during periods of battery rest, charge or discharge. The impedance data can be collected at a single distinct frequency, precision frequency, which can reduce the time and energy needed for extensive data collection and analysis. Furthermore, the method does not require use of complex equivalent circuit models.

The impedance information obtained using the proposed method can alert a user to remove suspect battery cells when an impedance values fall outside of the healthy zone. The healthy zone can be established for each battery type and depends upon chemistry, size and geometry. Finally, the hardware to implement the exemplary method can be incorporated into existing types of battery electronics circuitry.

Portions of the invention can comprise a computer program that embodies the functions described herein and illustrated in the appended flow charts. Furthermore, the modules described herein can be implemented in a computer system that comprises instructions stored in a machine-readable medium and a processor that executes the instructions. However, it should be apparent that there could be many different ways of implementing the invention in computer programming, and the invention should not be construed as limited to any one set of computer program instructions. Further, a skilled programmer would be able to write such a computer program to implement an exemplary embodiment based on the flow charts and associated description in the application text. Therefore, disclosure of a particular set of program code instructions is not considered necessary for an adequate understanding of how to make and use the invention. The inventive functionality of the claimed computer is explained herein in more detail read in conjunction with the figures illustrating the program flow.

It should be understood that the foregoing relates only to illustrative embodiments of the present invention, and that numerous changes may be made therein without departing from the scope and spirit of the invention as defined by the following claims.

The invention claimed is:

1. A method for monitoring the health of a battery, comprising the steps of:
    determining a precision frequency for the battery by applying one of an AC current or voltage perturbation across a frequency sweep with impedance spectroscopy equipment to obtain an impedance response and collecting impedance value data related to the impedance response at a plurality of various states of charge within a recommended voltage window of the battery;
    applying one of an AC current or voltage perturbation at the precision frequency resulting in an impedance response;
    recording a value of the impedance response; and
    determining a battery classification zone that the impedance value falls within,
    wherein the precision frequency is determined by where the impedance values are nearly the same across the various states of charge,
    wherein the precision frequency is a frequency at which the standard deviation of the impedance value data is the smallest between the varying states of charge.

2. The method of claim 1, wherein the precision frequency is determined by statistical analysis of baseline impedance measurements taken between normal operating voltage ranges of the battery.

3. The method of claim 1, wherein step of determining a precision frequency for the battery further comprises the step of plotting the collected data on one or more impedance curves.

4. The method of claim 3, further comprising the step of analyzing the one or more impedance curves at the various states of charge to determine the precision frequency.

5. The method of claim 1, wherein the health of the battery can be determined in real time.

6. The method of claim 1, wherein the health of the battery can be determined during periods of battery rest, charge or discharge.

7. The method of claim 1, wherein the method is able to diagnose internal battery degradation due to abuse.

8. The method of claim 7, wherein the abuse can comprise battery overcharge and battery over-discharge.

9. The method of claim 1, wherein the battery classification zones comprise a healthy battery zone, a damaged battery zone, and an unsafe battery zone.

10. A battery health monitoring system, comprising:
    impedance spectroscopy equipment configured to determine a precision frequency for a battery by applying one of an AC current or voltage perturbation across a frequency sweep to obtain an impedance response; collect impedance value data related to the impedance response at a plurality of various states of charge within a recommended voltage window of the battery; apply one of an AC current or voltage perturbation at the determined precision frequency resulting in an impedance response; and record a value of the impedance response; and
    a battery classification zone module configured to determine a battery classification zone that the recorded impedance value falls within, wherein the precision frequency is determined by where the impedance values are nearly the same across the various states of charge, wherein the precision frequency is a frequency at which the standard deviation of the impedance value data is the smallest between the varying states of charge.

11. The system of claim 10, further comprising a precision frequency computer module configured to plot the collected data on one or more impedance curves, and analyze the one or more impedance curves at the various states of charge to determine the precision frequency.

12. The system of claim 10, wherein the impedance spectroscopy equipment comprises a potentiostat configured to apply one of an AC current or voltage perturbation.

13. The system of claim 10, wherein the impedance spectroscopy equipment comprises an impedance gain-phase analyzer configured to measure the impedance response.

14. The system of claim 10, wherein the wherein the impedance spectroscopy equipment comprises at least two leads to connect to a positive terminal and a negative terminal of the battery.

15. The system of claim 10, further comprising a display configured to display the determined battery classification zone.

16. The method of claim 1, wherein the precision frequency is a single impedance data point.

17. The system of claim 10, wherein the precision frequency is a single impedance data point.

* * * * *